US007676336B2

(12) United States Patent
Herre et al.

(10) Patent No.: US 7,676,336 B2
(45) Date of Patent: *Mar. 9, 2010

(54) WATERMARK EMBEDDING

(75) Inventors: Juergen Herre, Buckenhof (DE); Ralph Kulessa, Hilpoltsein (DE); Sascha Disch, Fuerth (DE); Karsten Linzmeier, Erlangen (DE); Christian Neubauer, Nuremberg (DE); Frank Siebenhaar, Nuerberg (DE)

(73) Assignee: Fraunhofer-Gesellschaft zur Foerderung der Angewandten Forschung E.V., Munich (DE)

(*) Notice: Subject to any disclaimer, the term of this patent is extended or adjusted under 35 U.S.C. 154(b) by 370 days.

This patent is subject to a terminal disclaimer.

(21) Appl. No.: 11/554,492

(22) Filed: Oct. 30, 2006

(65) Prior Publication Data

US 2008/0027729 A1 Jan. 31, 2008

Related U.S. Application Data

(63) Continuation of application No. PCT/EP2005/002636, filed on Mar. 11, 2005.

(30) Foreign Application Priority Data

Apr. 30, 2004 (DE) ...................... 10 2004 021 404

(51) Int. Cl.
*G01R 23/16* (2006.01)
*G06F 17/14* (2006.01)

(52) U.S. Cl. ............................ 702/77; 702/66; 702/75; 702/76; 702/189; 708/404; 708/405

(58) Field of Classification Search .................. 702/57, 702/66, 75–78, 106, 189; 708/400, 403–405
See application file for complete search history.

(56) References Cited

U.S. PATENT DOCUMENTS 5,173,923 A * 12/1992 Crespo et al. ............... 375/343

(Continued)

FOREIGN PATENT DOCUMENTS

CA 2332548 10/2003

(Continued)

OTHER PUBLICATIONS

M. Celik et al., “Collusion-Resilient Fingerprinting Using Random Pre-Warping”, Image Processing, Proceedings in 2003 International Conference on Sep. 14-17, 2003, vol. 1, pp. I-509 to I-512, vol. 1.

(Continued)

*Primary Examiner*—Eliseo Ramos Feliciano
*Assistant Examiner*—Mi’schita’ Henson
(74) *Attorney, Agent, or Firm*—Michael A. Glenn; Glenn Patent Group

(57) ABSTRACT

According to an inventive scheme for introducing a watermark into an information signal, the information signal is at first transferred from a time representation to a spectral/modulation spectral representation). The information signal is then manipulated in the spectral/modulation spectral representation in dependence on the watermark to be introduced to obtain a modified spectral/modulation spectral representation, and subsequently an information signal provided with a watermark is formed based on the modified spectral/modulation spectral representation. An advantage is that, due to the fact that the watermark is embedded and/or derived in the spectral/modulation spectral representation or range, traditional correlation attacks as are used in watermark methods based on a spread-band modulation cannot succeed easily.

25 Claims, 3 Drawing Sheets

U.S. PATENT DOCUMENTS

| | | | | |
|---|---|---|---|---|
| 5,321,497 | A * | 6/1994 | Ai et al. | 356/514 |
| 5,671,168 | A | 9/1997 | Liu et al. | |
| 5,724,270 | A | 3/1998 | Posch | |
| 5,930,369 | A | 7/1999 | Cox et al. | |
| 6,073,153 | A * | 6/2000 | Malvar | 708/400 |
| 6,330,672 | B1 * | 12/2001 | Shur | 713/176 |
| 6,374,036 | B1 | 4/2002 | Ryan et al. | |
| 6,584,138 | B1 | 6/2003 | Neubauer et al. | |
| 6,725,372 | B1 | 4/2004 | Lewis et al. | |
| 7,254,500 | B2 | 8/2007 | Makeig et al. | |
| 2002/0006203 | A1 | 1/2002 | Tachibana et al. | |
| 2002/0168082 | A1 * | 11/2002 | Razdan | 382/100 |
| 2002/0176353 | A1 | 11/2002 | Atlas et al. | |
| 2002/0176365 | A1 | 11/2002 | Lund | |
| 2003/0093282 | A1 * | 5/2003 | Goodwin | 704/500 |
| 2003/0185411 | A1 | 10/2003 | Atlas et al. | |
| 2004/0024588 | A1 * | 2/2004 | Watson et al. | 704/200.1 |
| 2004/0184369 | A1 | 9/2004 | Herre | |

FOREIGN PATENT DOCUMENTS

| | | | |
|---|---|---|---|
| DE | 19640814 | | 9/1997 |
| DE | 19947877 | | 10/2001 |
| DE | 10129239 | | 10/2002 |
| EP | 0840513 | A2 | 5/1998 |
| EP | 0947953 | A2 | 10/1999 |
| WO | WO9733391 | | 9/1997 |
| WO | WO 01/26262 | | 4/2001 |
| WO | WO 01/54053 | | 7/2001 |
| WO | WO03096337 | | 11/2003 |

OTHER PUBLICATIONS

C. Neubauer et al., “A Compatible Family of Bitstream Watermarking Schemes for MPEG-Audio,” Proceedings in the AES 110$^{th}$ Convention, May 12-15, 2001, Amsterdam, The Netherlands, pp. 1-12.

T. Houtgast, “Frequency Selectivity in Amplitude-Modulation Detection,” J. Acoust. Soc Am. 85 (4), Apr. 1989, pp. 1676-1680.

J. Thompson et al., “A Non-Uniform Modulation Transform for Audio Coding with Increased Time Resolution,” Proceedings of the 2003 IEEE ICASSP, vol. 5, pp. 397-400, 2003.

C. Neubauer et al., “Advanced Watermarking and its Applications,” Presented at the 109$^{th}$ Convention, Sep. 22-25, 2000, Los Angeles, CA, pp. 1-19.

J. Haitsma et al., “Audio Watermarking for Monitoring and Copy Protection,” International Multimedia Conference Archive, Proceedings of the 2000 ACM Workshops on Multimedia, Los Angeles, CA, pp. 119-122, 2000.

C. Neubauer et al., “Digital Watermarking and its Influence on Audio Quality,” Preprint No. 4823, Presented at AES 105$^{th}$ Convention, Aug. 1998, pp. 9798-9809.

C. Neubauer et al., “Audio Watermarking of MPEG-2 AAC Bit Streams,” Presented at the AES 108$^{th}$ Convention, Feb. 19-22, 2000, Paris, France, pp. 1-19.

F. Siebenhaar et al., “Combined Compression/Watermarking for Audio Signals,” AES Convention Paper 5344, Presented at the AES 110$^{th}$ Convention, May 12-15, 2001, Amsterdam, The Netherlands, pp. 1-10.

M. Van Der Veen et al., “Robust, Multi-Functional and High-Quality Audio Watermarking Technology,” AES Convention Paper 5345, Presented at the AES 110$^{th}$ Convention, May 12-15, 2001, Amsterdam, The Netherlands, pp. 1-9.

M. Vinton et al., “A Scalable and Progressive Audio Codec,” Appeared in IEEE ICASSP, May 7-11, 2001, Salt Lake City, Utah, pp. 1-4.

J. Dittmann, “Combining Digital Watermarks and Collusion Secure Fingerprints for Customer Copy Monitoring,” Journal of Electronic Imaging, Oct. 2000, vol. 9, Issue 4, pp. 456-467.

L. Atlas et al. “Joint Acoustic and Modulation Frequency,” EURASIP Journal on Applied Signal Processing, 2003, vol. 7, pp. 668-675.

The English Translation of the Korean Office Action for parallel application, Document No. 9-5-2009-021647588, dated May 22, 2009.

The English Translation of the Russian Decision to Grant received on Jun. 30, 2009 for parallel Russian patent application 2006142304/09(046188).

* cited by examiner

WATERMARK EMBEDDING

CROSS-REFERENCE TO RELATED APPLICATION

This application is a continuation of copending International Application No. PCT/EP2005/002636, filed Mar. 11, 2005, which designated the United States and was not published in English, and is incorporated herein by reference in its entirety.

BACKGROUND OF THE INVENTION

1. Field of the Invention

The present invention relates to a scheme for introducing a watermark into an information signal, such as, for example, an audio signal.

2. Description of Related Art

With the increasing spreading of the Internet, music piracy, too, has increased dramatically. Pieces of music or general audio signals are offered at many sites on the Internet to be downloaded. Only in very few cases are copyrights observed here. In particular, the author is very rarely asked for permission to make his or her work available. Even less frequently, charges as a price for legal copying are paid to the author. Additionally, works are copied in an uncontrolled manner, which in most cases also takes place without observing copyrights.

When pieces of music are legally purchased via the Internet from a provided for pieces of music, the provider will usually generate a header or a data block added to the piece of music in which copyright information, such as, for example, a customer number, is introduced, wherein the customer number unambiguously refers to the current purchaser. Also, it is known to introduce copy permission information into this header signaling most different kinds of copyrights, such as, for example, that copying the current piece is prohibited altogether, that copying the current piece is only allowed once, that copying the current piece is completely free, etc. The customer has a decoder or managing software reading in the header and, observing the actions allowed, for example only allowing a single copy and refusing further copies, or the like.

This concept for observing copyrights, however, will only work for customers acting legally. Illegal customers usually have a considerable potential of creativity for "cracking" the pieces of music provided with a header. Here, the disadvantage of the procedure described for protecting copyrights becomes obvious. Such a header can simply be removed. Alternatively, an illegal user might also modify individual entries in the header in order to convert the entry "copying prohibited" to an entry "copying completely free". Also, it is feasible for an illegal customer to remove his own customer number from the header and then to offer the piece of music on his or her own or another homepage on the Internet. From this moment on, it is no longer possible to determine the illegal customer, since his or her customer number has been removed.

A coding method for introducing an inaudible data signal into an audio signal is known from WO 97/33391. Thus, the audio signal into which the inaudible data signal, which is referred to as watermark here, is to be introduced is transformed to the frequency domain to determine the masking threshold of the audio signal by means of a psycho-acoustic model. The data signal to be introduced into the audio signal is modulated by a pseudo-noise signal to provide a frequency-spread data signal. The frequency-spread data signal is then weighted by the psycho-acoustic masking threshold such that the energy of the frequency-spread data signal will always be below the masking threshold. Finally, the weighted data signal is superimposed on the audio signal, which is how an audio signal into which the data signal is introduced without being audible is generated. On the one hand, the data signal can be used to add author information to the audio signal, and alternatively the data signal may be used for characterizing audio signals to easily identify potential pirate copies since every sound carrier, such as, for example, in the form of a Compact Disc, is provided with an individual tag when manufactured.

Embedding a watermark in an uncompressed audio signal, wherein the audio signal is still in the time domain or in time domain representation, is also described in C. Neubauer, J. Herre: "Digital Watermarking and its Influence on Audio Quality", $105^{th}$ AES Convention, San Francisco 1998, Preprint 4823 and in DE 196 40 814.

However, audio signals are often already present as compressed audio data streams which have, for example, been subjected to processing according to one of the MPEG audio methods. If one of the above watermark embedding methods was used here to provide pieces of music with a watermark before delivering same to a customer, they would have to be decompressed completely before introducing the watermark to again obtain a sequence of time domain audio values. Due to the additional decoding before embedding the watermark, however, this means, apart from high calculating complexity, that there is the danger of tandem coding effects to occur when coding again when these audio signals provided with watermarks are coded again.

This is why schemes have been developed for embedding a watermark in audio signal already compressed or compressed audio bit streams, which, among other things, have the advantage that they require low calculating complexity since the audio bitstream to be provided with a watermark need not be decoded completely, i.e. in particular applying analysis and synthesis filter banks to the audio signal may be omitted. Further advantages of these methods which may be applied to compressed audio signals are high audio quality since quantizing noise and watermark noise can be tuned exactly to each other, high robustness since the watermark is not "weakened" by a subsequent audio coder, and allowing a suitable selection of spread-band parameters so that compatibility with PCM (pulse code modulation) watermark methods or embedding schemes operating on uncompressed audio signals can be achieved. An overview of schemes for embedding watermarks in audio signals already compressed may be found in C. Neubauer, J. Herre: "Audio Watermarking of MPEG-2 AAC Bit Streams", $108^{th}$ AES Convention, Paris 2000, Preprint 5101 and, additionally, in DE 10129239 C1.

Another improved way of introducing a watermark into audio signals refers to those schemes performing embedding while compressing an audio signal still uncompressed. Embedding schemes of this kind have, among other things, the advantage of low calculating complexity since, by pulling together watermark embedding and coding, certain operations, such as, for example, calculating the masking model and converting the audio signal to the spectral range, only have to be performed once. Further advantages include higher audio quality since quantizing noise and watermark noise can be tuned exactly to each other, high robustness since the watermark is not "weakened" by a subsequent audio coder, and the possibility of a suitable selection of the spread-band parameters to achieve compatibility with the PCM watermark method. An overview of compressed watermark embedding/coding can, for example, be found in Siebenhaar, Frank;

Neubauer, Christian; Herre, Jürgen: "Combined Compression/Watermarking for Audio Signals", in 110$^{th}$ AES Convention, Amsterdam, preprint 5344; C. Neubauer, R. Kulessa and J. Herre: "A Compatible Family of Bitstream Watermarking Systems for MPEG-Audio", 110$^{th}$ AES Convention, Amsterdam, May 2000, Preprint 5346, and in DE 199 47 877.

In summary, watermarks for coded and uncoded audio signals in different variations are known. Using watermarks, additional data can be transferred within an audio signal in a robust and inaudible manner. Today, as has been shown above, there are different watermark embedding methods which differ in the domain of embedding, such as, for example, the time domain, the frequency domain, etc., and the type of embedding, such as, for example, quantization, erasing individual values, etc. Summarizing descriptions of existing methods may be found in M. van der Veen, F. Brukers and others: "Robust, Multi-Functional and High-Quality Audio Watermarking Technology", 110$^{th}$ AES Convention, Amsterdam, May 2002, Preprint 5345; Jaap Haitsma, Michiel van der Veen, Ton Kalker and Fons Bruekers: "Audio Watermarking for Monitoring and Copy Protection", ACM Workshop 2000, Los Angeles, and in DE 196 40 814 mentioned above.

Although the types of schemes for embedding a watermark into audio signals briefly explained before are already quite advanced, there is a disadvantage in that existing watermark methods have almost exclusively focused on the object of inaudibly embedding a watermark into the original audio signal with a high introduction rate and high robustness, i.e. having the characteristic of the watermark still being usable after signal alterations. Thus, for most fields of application the focus has been robustness. The most widespread method for providing audio signals with a watermark, i.e. spread-band modulation, as is exemplarily described in WO 97/33391 mentioned above, is said to be very robust and safe.

Due to its popularity and the fact that the principles of watermark methods based on spread-band modulation are generally known, there is the danger of methods by means of which conversely the watermarks from the audio signals provided with watermarks by these methods can be destroyed becoming known. For this reason, it is very important to develop novel high-quality methods which may serve as alternatives for spread-band modulation.

SUMMARY OF THE INVENTION

It is an object of the present invention to provide a completely novel and thus also safer scheme for introducing a watermark into an information signal.

In accordance with a first aspect, the present invention provides a device for introducing a watermark into an information signal, having: means for transferring the information signal from a time representation to a spectral/modulation spectral representation; means for modifying the information signal in the spectral/modulation spectral representation in dependence on the watermark to be introduced to obtain a modified spectral/modulation spectral representation; and means for forming an information signal provided with a watermark based on the modified spectral/modulation spectral representation.

In accordance with a second aspect, the present invention provides a device for extracting a watermark from an information signal provided with a watermark, having: means for transferring the information signal provided with a watermark from a time representation to a spectral/modulation spectral representation; and means for deriving the watermark based on the spectral/modulation spectral representation.

In accordance with a third aspect, the present invention provides a method for introducing a watermark into an information signal, having: transferring the information signal from a time representation to a spectral/modulation spectral representation; modifying the information signal in the spectral/modulation spectral representation in dependence on the watermark to be introduced to obtain a modified spectral/modulation spectral representation; and forming an information signal provided with a watermark based on the modified spectral/modulation spectral representation.

In accordance with a fourth aspect, the present invention provides a method for extracting a watermark from an information signal provided with a watermark, having: transferring the information signal provided with a watermark from a time representation to a spectral/modulation spectral representation; and deriving the watermark based on the spectral/modulation spectral representation.

In accordance with a fifth aspect, the present invention provides a computer program having a program code for performing one of the above methods when the computer program runs on a computer.

According to an inventive scheme for introducing a watermark into an information signal, the information signal is at first transferred from a time representation to a spectral/modulation spectral representation. Then, the information signal is manipulated in the spectral/modulation spectral representation in dependence on the watermark to be introduced to obtain a modified spectral/modulation spectral representation, and subsequently an information signal provided with a watermark is formed based on the modified spectral/modulation spectral representation.

According to an inventive scheme for extracting a watermark from an information signal provided with a watermark, the information signal provided with a watermark is correspondingly transferred from a time representation to a spectral/modulation spectral representation, whereupon the watermark is derived based on the spectral/modulation spectral representation.

It is an advantage of the present invention that, due to the fact that according to the present invention the watermark is embedded and derived in the spectral/modulation spectral representation and range, traditional correlation attacks, as are used in the watermark methods based on spread-band modulation, will not succeed easily. Here, it is of positive effect that the analysis of a signal in the spectral/modulation spectral range is still new ground for potential attackers.

Furthermore, the inventive embedding of the watermark in the spectral/modulation spectral range or in the two-dimensional modulation spectral/spectral level offers considerably more variations of the embedding parameters, such as, for example, at which "locations" in this level embedding is localized, than has been the case so far. Selecting the corresponding locations may thus also take place with time variance.

In the case of an audio signal as the information signal, it may additionally also be possible by embedding the watermark in the spectral/modulation spectral range to embed a watermark inaudibly, without the complicated calculation of conventional psycho-acoustic parameters, such as, for example, the listening threshold, to thus nevertheless ensure inaudibility of the watermark with little complexity. The modification of the modulation values here may, for example, be performed utilizing masking effects in the modulation spectral range.

BRIEF DESCRIPTION OF THE DRAWINGS

Preferred embodiments of the present invention will be detailed subsequently referring to the appended drawings, in which.

DESCRIPTION OF PREFERRED EMBODIMENTS

Subsequently, a scheme for embedding a watermark into an audio signal will be described referring to FIGS. 1-3, wherein at first an incoming audio signal or audio input signal present in a time domain or a time representation is transferred block by block to a time/frequency representation and, from there, to a frequency/modulation frequency representation. The watermark will then be introduced into the audio signal in this representation by modifying modulation values of the frequency/modulation frequency domain representation in dependence on the watermark. Modified in this way, the audio signal will then again be transferred to the time/frequency domain and, from there, to the time domain.

Figure 1:
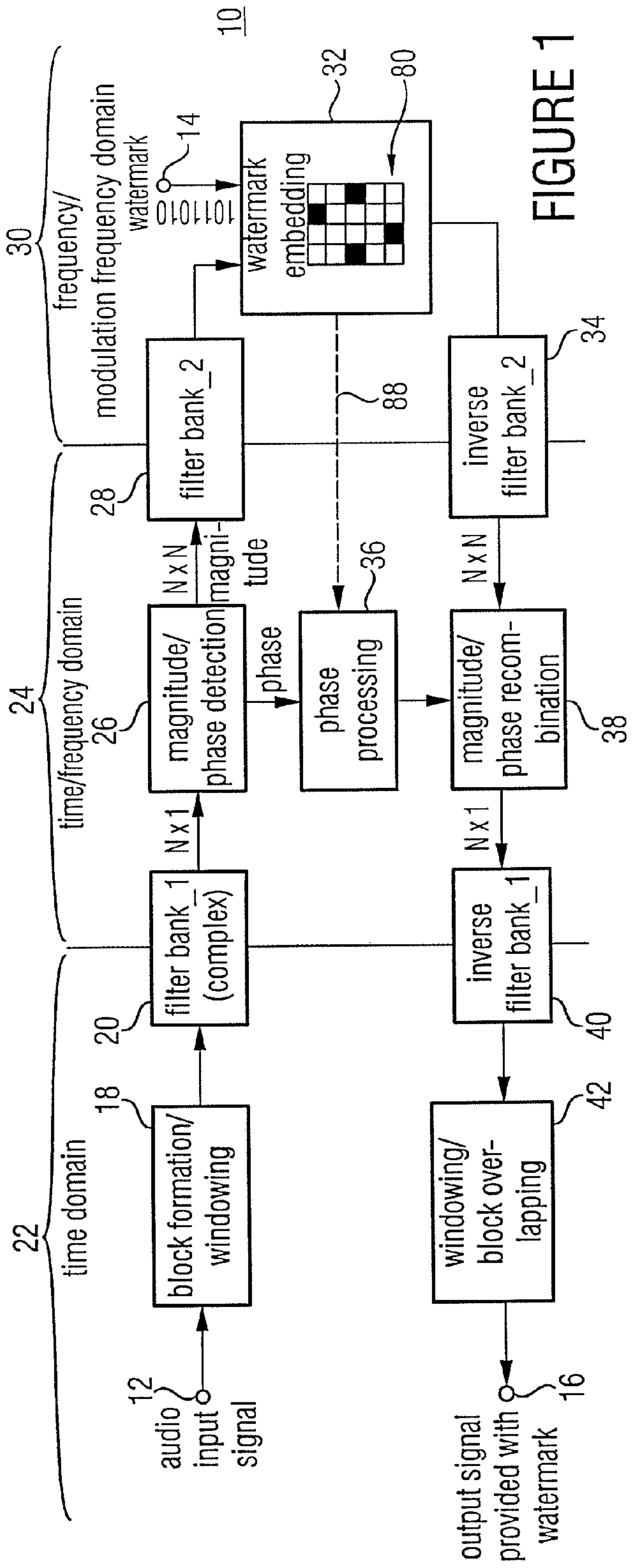
FIG. 1 is a block diagram of a device for embedding a watermark into an audio signal according to an embodiment of the present invention.
Figure 3:
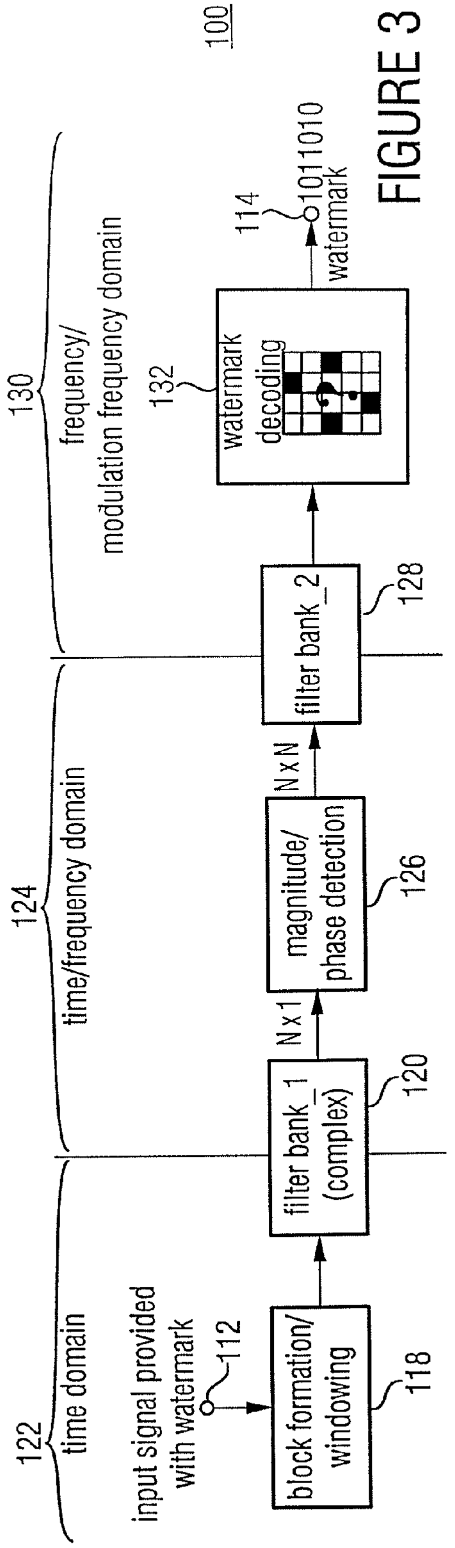
FIG. 3 is a block diagram of a device for extracting a watermark embedded by the device of FIG. 1 from an audio signal provided with a watermark.
Figure 2:
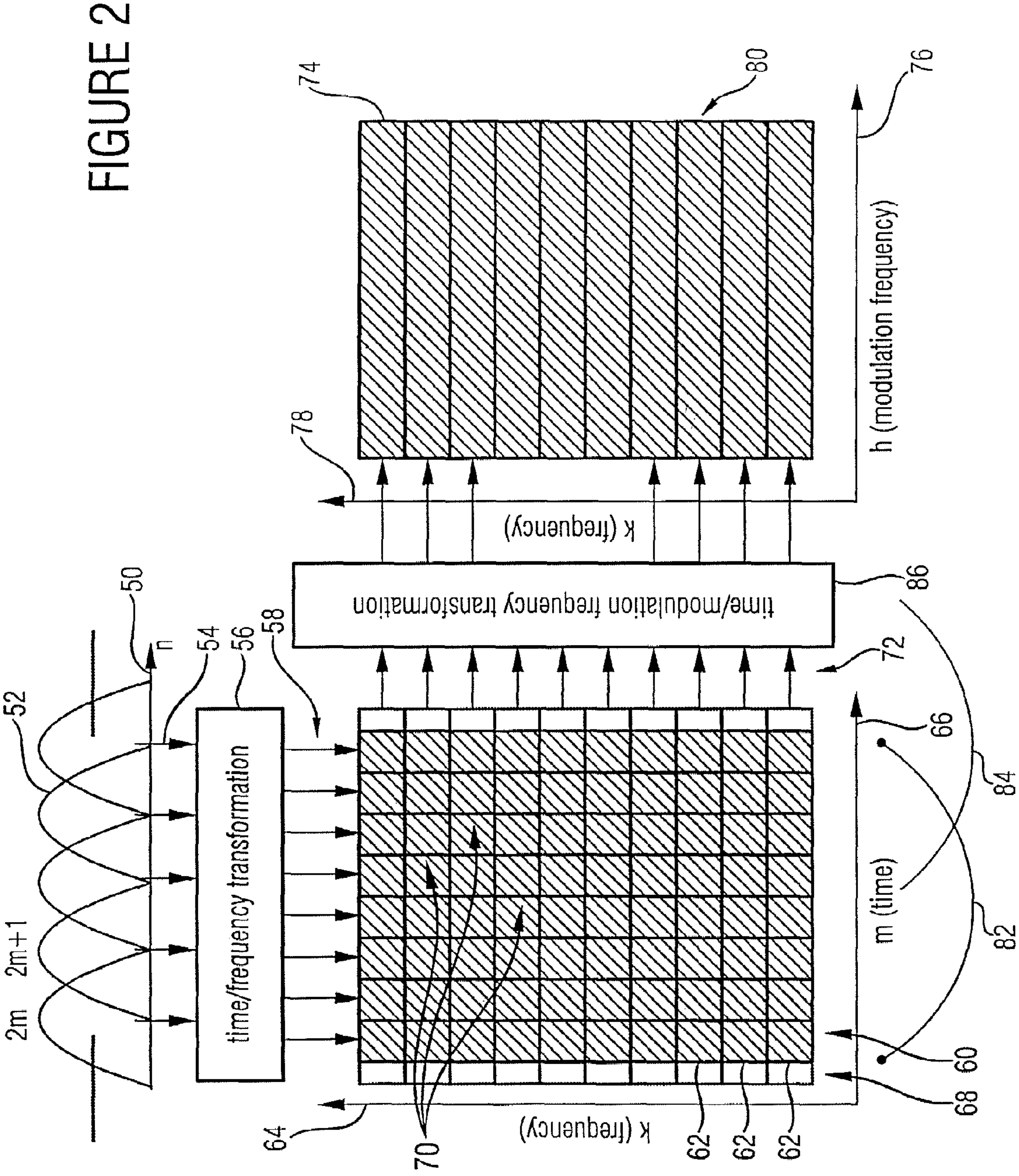
FIG. 2 is a schematic drawing for illustrating the transfer of an audio signal to a frequency/modulation frequency domain on which the device of FIG. 1 is based.

Embedding the watermark according to the scheme of FIGS. 1-3 is performed by the device according to FIG. 1, which will subsequently be referred to as watermark embedder and is indicated by the reference numeral 10. The embedder 10 includes an input 12 for receiving the audio input signal into which the watermark to be introduced is to be introduced. The embedder 10 receives the watermark, such as, for example, a customer number, at an input 14. Apart from the inputs 12 and 14, the embedder 10 includes an output 16 for outputting the output signal provided with the watermark.

Internally, the embedder 10 includes windowing means 18 and a first filter bank 20 which are connected in series after the input 12 and are responsible for transferring the audio signal at the input 12 from the time domain 22 to the time/frequency domain 24 by a block-by-block processing. What follows after the output of the filter bank 20 is magnitude/phase detection means 26 to divide the time/frequency domain representation of the audio signal into magnitude and phase. A second filter bank 28 is connected to the detection means 26 to obtain the magnitude portion of the time/frequency domain representation, and transfers the magnitude portion into the frequency/modulation frequency domain 30 to generate a frequency/modulation frequency representation of the audio signal 12 in this manner. Blocks 18, 20, 26, 28 thus represent an analysis part of the embedder 10 achieving a transfer of the audio signal to the frequency/modulation frequency representation.

Watermark embedding means 32 is connected to the second filter bank 28 to receive the frequency/modulation frequency representation of the audio signal 12 from it. Another input of the watermark embedding means 32 is connected to the input 14 of the embedder 10. The watermark embedding means 32 generates a modified frequency/modulation frequency representation.

An output of the watermark embedding means 32 is connected to an input of a filter bank 34 inverse to the second filter bank 28, which is responsible for re-transfer to the time/frequency domain 24. Phase processing means 36 is connected to the detection means 26 to obtain the phase portion of the time/frequency domain representation 24 of the audio signal and to pass it on in a manipulated form, as will be described below, to recombining means 38 which is additionally connected to an output of the inverse filter bank 34 to obtain the modified magnitude portion of the time/frequency representation of the audio signal. The recombining means 38 unites the phase portion modified by the phase processing 36 and the magnitude portion of the time/frequency domain representation of the audio signal modified by the watermark and outputs the result, i.e. the time/frequency representation of the audio signal provided with a watermark, to a filter bank 40 inverse to the first filter bank 20. Windowing means 42 is connected between the output of the inverse filter bank 40 and the output 16. The part of the components 34, 38, 40, 42 may be considered to be the synthesis part of the embedder 10 since it is responsible for generating the audio signal provided with a watermark in the time representation from the modified frequency/modulation frequency representation.

The setup of the embedder 10 having been described above, its mode of functioning will be described below.

Embedding starts with the transfer of the audio signal at the input 12 from the time representation to the time/frequency representation by the means 18 and 20, wherein it is assumed that the audio input signal at the input 12 is present in a type sampled by a predetermined sample frequency, i.e. as a sequence of samples or audio values. If the audio signal is not yet in such a sampled form, a corresponding A/D converter may be used here as sampling means.

The windowing means 18 receives the audio signal and extracts from it a sequence of blocks of audio values. For this, the windowing means 18 unites a predetermined number of successive audio values of the audio signal at the input 12 each to form time blocks and multiplies or windows these time blocks representing a time window from the audio signal 12, by a window or weighting function, such as, for example, a sine window, a KBD window or the like. This process is referred to as windowing and is exemplarily performed such that the individual time blocks refer to time sections of the audio signal overlapping one another, such as, for example, by one half, so that each audio value is allocated to two time blocks.

The process of windowing by the means 18 is exemplarily illustrated in greater detail in FIG. 2 for the case of 50% overlapping. FIG. 2 illustrates by an arrow 50 the sequence of audio values in the time sequence of how they arrive at the input 12. They represent the audio signal 12 in the time domain 22. The index n in FIG. 2 is to refer to an index of the audio values increasing in the direction of the arrow 52 indicates the window functions the windowing means 18 applies to the time blocks. The first two windowing functions for the first two time blocks are headed in FIG. 2 by the index $2m$ and $2m+1$, respectively. As can be recognized, the time block $2m$ and the subsequent time block $2m+1$ overlap by one half or 50% and thus each have half of their audio values in common. The blocks generated by the means 18 and passed on to the filter bank 20 correspond to a weighting of the audio values belonging to a time block by the window function 52 or a multiplication of same.

The filter bank 20 receives the time blocks or blocks of windowed audio values, as is indicated in FIG. 2 by arrows 54, and transfers same by a time/frequency transform 52 block by block to a spectral representation. Thus, the filter bank performs a predetermined separation of the spectral range into predetermined frequency bands or spectral components, depending on the design. The spectral representation exemplarily includes spectral values having frequencies next to one another from the frequency zero to the maximum audio frequency on which the audio signal is based and which is, exemplarily, 44.1 kHz. FIG. 2 represents the exemplary case of a spectral separation into ten subbands.

The block-by-block transfer is indicated in FIG. 2 by a plurality of arrows 58. Each arrow corresponds to the transfer of one time block to the frequency domain. Exemplarily, the time block 2*m* is transferred to a block 60 of spectral values 62, as is indicated in FIG. 2 by a column of boxes. The spectral values each refer to a different frequency component or a different frequency band, wherein in FIG. 2 the direction along which the frequency k is is to be indicated by the axis 64. As has already been mentioned, it is assumed that there are only ten spectral components, wherein, however, the number is only of illustrative nature and will, in reality, probably be higher.

Since the filter bank 20 generates one block 60 of spectral values 62 per time block, several sequences of spectral values 62 result over time, namely one per spectral component k or subband k. In FIG. 2, these time sequences are in the direction of the line, as is represented by the arrow 66. The arrow 66 thus represents the time axis of the time/frequency representation, whereas the arrow 64 represents the frequency axis of this representation. The "sample frequency" or the repeat distance of the spectral values within the individual subbands corresponds to the frequency or the repeat distance of the time blocks from the audio signal. The time block repeat frequency in turn corresponds to twice the sample frequency of the audio signal divided by the number of audio values per time block. Thus, the arrow 66 corresponds to a time dimension in so far as it typifies the time sequence of the time blocks.

As can be recognized, a matrix 68 of spectral values 62 representing a time/frequency domain representation 24 of the audio signal over the duration of these time blocks forms over a certain number, here exemplarily a number of 8, of successive time blocks.

The time/frequency transform 56 performed block by block on the time blocks by the filter bank 20 is, for example, a DFT, DCT, MDCT or the like. Depending on the transform, the individual spectral values within a block 60 are divided into certain subbands. For each subband, each block 60 may comprise more than one spectral value 62. All in all, the result, over the sequence of time blocks, is a sequence of spectral values representing the time form of the respective subband and in FIG. 2 being in the direction of the line 84 per subband or spectral component.

The filter bank 20 passes on the blocks 60 of spectral values 62 to the magnitude/phase detection means 26 block by block. The latter processes the complex spectral values and will only pass on the magnitudes thereof to the filter bank 28. However, it passes on the phases of the spectral values 62 to the phase processing means 36.

The filter bank 28 processes the sequences 70 of magnitudes of spectral values 62 per subband similarly to the filter bank 20, namely by block-by-block transforming these sequences block by block to the spectral representation or the modulation frequency representation, again preferably using windowed and overlapping blocks, wherein the basic blocks of all subbands are preferably time-oriented to one another equally. Put differently, the filter bank 28 will process N spectral blocks 60 of spectral value magnitudes each at the same time or together. The N spectral blocks 60 of spectral value magnitudes form a matrix 68 of spectral value magnitudes. If there are, for example, M subbands, the filter bank 28 will process the spectral value magnitudes in matrices of N*M spectral value magnitudes each. FIG. 3 assumes the exemplary case that M=N, whereas it is exemplarily assumed in FIG. 2 that N=10 and M=8. Passing on the magnitude portion of such a matrix 68 of spectral value magnitudes 68 to the filter bank 28 is indicated in FIG. 2 by the arrows 72.

After receiving the magnitude portion N of successive spectral blocks or the matrix 68, the filter bank 28 will transform—separate for each subband—the blocks of spectral value magnitudes of the respective subbands, i.e. the lines in the matrix 58, from the time domain 66 to a frequency representation, wherein, as has already been mentioned, the spectral value magnitudes may be windowed to avoid aliasing effects. Put differently, the filter bank 28 will transfer each of these spectral value magnitude blocks from the sequences 70 representing the time form of a respective subband to a spectral representation and thus generate one block of modulation values per subband, which in FIG. 2 are indicated by 74. Each block 74 contains several modulation values which are not illustrated in FIG. 2. Each of these modulation values within a block 74 is associated to a different modulation frequency, which in FIG. 2 is to be along the axis 76, which thus represents the modulation frequency axis of the frequency/modulation frequency representation. By arranging the blocks 74 depending on the subband frequency along an axis 78, a matrix 80 of modulation values forms representing a frequency/modulation frequency domain representation of the audio signal at the input 12 in the time section associated to the matrix 68.

As has already been mentioned, for avoiding artifacts the filter bank 28 or the means 26 may comprise internal window means (not shown) subjecting, per subband, the transform blocks, i.e. the lines of the matrix 68, of spectral values to windowing by a window function 82 before the respective time/modulation frequency transform 80 by the filter bank 28 to the modulation frequency domain 30 to obtain the blocks 74.

Again, it is pointed out explicitly that a sequence of matrices 80, which in the 50% overlap windowing exemplarily mentioned before overlap in time by 50% is processed in the manner described above. Put differently, the filter bank 28 forms the matrix 80 for successive N time blocks such that the matrices 80 each refer to N time blocks which overlap by one half, as is exemplarily to be indicated in FIG. 2 by a broken window function 84 which represents windowing for the next matrix.

The modulation values of the frequency/modulation frequency domain representation 30, as are output by the filter bank 28, reach the watermark embedding means 32. The watermark embedding means 32 then modifies the modulation matrix 80 or individual or several ones of the modulation values of the modulation matrices 80 of the audio signal 12. The modification performed by the means 32 may, for example, take place by a multiplicative weighting of individual modulation frequency/frequency segments of the modulation subband spectrum or of the frequency/modulation frequency domain representation, i.e. by a weighting of the modulation values within a certain region of the frequency/modulation frequency space spanned by the axes 76 and 78. Also, the modification might include setting individual segments or modulation values to certain values.

The multiplicative weighting or the certain values would depend on the watermark obtained at the input 14 in a predetermined manner. Thus, setting individual modulation values or segments of modulation values to certain values would take place in a signal-adaptive manner, i.e. additionally depending on the audio signal 12 itself.

The individual segments of the 2-dimensional modulation subband spectrum can, on the one hand, be obtained by subdividing the acoustic frequency axis 78 into frequency groups, on the other hand further segmentation may be performed by subdividing the modulation frequency axis 76 into modulation frequency groups. In FIG. 1, exemplarily segmentation of the frequency axis into 5 groups and of the modulation frequency axis into 4 groups is indicated, resulting in 20 segments. The dark segments exemplarily indicate those locations where the means 32 modifies the modulation matrix 80, wherein, as has been mentioned before, the locations used for modification may vary in time. The locations are preferably selected such that by masking effects the changes in the audio signal in the frequency/modulation frequency representation are inaudible or hardly audible.

After the means 32 has modified the modulation matrix 80, it will send the modified modulation values of the modulation matrix 80 to the inverse filter bank 34 which re-transfers, by means of a transform which is inverse to that of the filter bank 28, i.e., for example, an IDFT, IFFT, IDCT, IMDCT or the like, the modulation matrix 80 to the time/frequency domain representation 24 on a block 74-wise manner, i.e. divided per subband, along the modulation frequency axis 76, to obtain modified magnitude portion spectral values in this way. Put differently, the inverse filter bank 34 transforms each block of modified modulation values 74 belonging to a certain subband by a transform inverse to the transform 86 to a sequence of magnitude portion spectral values per subband, the result, according to the above embodiment, being a matrix of N×M magnitude portion spectral values.

The magnitude portion spectral values from the inverse filter bank 34 will consequently always relate to two-dimensional blocks or matrices from the stream of sequences of spectral values, of course in a form modified by the watermark. According to the exemplary embodiment, these blocks overlap by 50%. Means (not shown) exemplarily provided in the means 34 then compensates the windowing in this exemplary 50% overlapping case by adding the overlapping recombined spectral values of successive matrices of spectral values obtained by retransforming successive modulation matrices. Here, streams or sequences of modified spectral values form again from the individual matrices of modified spectral values, namely one per subband. These sequences correspond only to the magnitude portion of the unmodified sequences 70 of spectral values, as have been output by means 20.

The recombining means 38 combines the magnitude portion spectral values of the inverse filter bank 34 united to form subband streams with the phase portions of the spectral values 62, as have been isolated by the detection means 26 directly after the transform 56 by the first filter bank 20, but in a form modified by the phase processing 36. The phase processing means 36 modifies the phase portions in a manner separated from watermark embedding by the means 32 but maybe depending on this embedding such that the detectability of the watermark in the detector or decoder system, which will be explained later referring to FIG. 3, is better to detect and/or acoustic masking of the watermark signal in the output signal provided with a watermark to be output at the output 16 and thus the inaudibility of the watermark are improved. Recombination can be performed by the recombining means 38 matrix by matrix per matrix 68 or continually over the sequences of modified magnitude portion spectral values per subband. The optional dependence of the manipulation of the phase portion of the time/frequency representation of the audio signal at the input 12 on the manipulation of the frequency/modulation frequency representation by the manipulation means 32 is illustrated in FIG. 1 by an arrow 88 indicated in a broken line. The recombination is, for example, performed by adding the phase of a spectral value to the phase portion of the corresponding modified spectral value, as is output by the filter bank 34.

In this manner, the means 38 thus generates sequences of spectral values per subband like that having been obtained directly after the filter bank 20 from the unchanged audio signal, namely the sequences 70, but in a form altered by the watermark, so that the spectral values recombined and output by the means 38 and modified with regard to the magnitude portion represent a time/frequency representation of the audio signal provided with a watermark.

The inverse filter bank 40 thus again obtains sequences of modified spectral values, namely one per subband. Put differently, the inverse filter bank 40 obtains one block of modified spectral values per cycle, i.e. one frequency representation of the audio signal provided with a watermark relating to one time section. Correspondingly, the filter bank 40 performs a transform inverse to the transform 56 of the filter bank 20 at each such block of spectral values, i.e. spectral values arranged along the frequency axis 70, to obtain as a result modified windowed time blocks or time blocks of windowed modified audio values. The subsequent windowing means 42 compensates windowing, as has been introduced by the windowing means 18, by adding audio values corresponding to one another within the overlapping regions, the result of which is the output signal provided with a watermark in the time domain representation 22 at the output 16.

The embedding of a watermark according to the embodiment of FIGS. 1-2 having been described before, subsequently a device will be described subsequently referring to FIG. 3 which is suitable to successfully analyze an output signal provided with a watermark and generated by the embedder 10 in order to reconstruct or detect again the watermark from it which is contained in the output signal provided with a watermark together with the useful audio information in a manner which is preferably inaudible for human hearing.

The watermark decoder of FIG. 3 which is generally indicated by 100, includes an audio signal input 112 for receiving the audio signal provided with a watermark and an output 114 for outputting the watermark extracted from the audio signal provided with a watermark. After the input 112, there are, connected in series and in the order as is listed subsequently, windowing means 118, a filter bank 120, magnitude/phase detection means 126 and a second filter bank 128, which in their functions and modes of operation correspond to blocks 18, 20, 26 and 28 from the embedder 10. This means that the audio signal provided with a watermark at the input 112 is transferred by the window means 118 and the filter bank 120 from the time domain 122 to the time frequency domain 124, from where transfer of the audio signal at the input 112 to the frequency/modulation frequency domain 130 takes place by the detection means 126 and the second filter bank 128. The audio signal provided with a watermark is then subjected to the same processing by the means 118, 120, 126 and 128 as have been described referring to FIG. 2 with regard to the original audio signal. The resulting modulation matrices, however, do not completely correspond to those as have been output in the embedder 10 by the watermark embedding means 32 since some of the modulation portions are changed with regard to the modified modulation matrices, as are output by the means 32, by the phase recombinations of the recombining means 38 and are thus represented in a somewhat changed form in the output signal provided with a watermark. Windowing reversal or OLA, too, changes the modulation portions up to the renewed modulation spectral analysis in the decoder 100.

Watermark decoding means 132 connected to the filter bank 128 for obtaining the frequency/modulation domain representation of the input signal provided with a watermark or the modulation matrices is provided to extract the watermark originally introduced by the embedder 10 from this representation and output same at the output 114. The extraction is performed at predetermined locations of the modulation matrices corresponding to those having been used by the embedder 10 for embedding. Matching selection of the locations is, for example, ensured by a corresponding standardization.

Alterations of the modulation matrices caused compared to the modulation matrices as have been generated in the embedder 10 in the means 32, as are fed to the watermark decoding means 132, may also be caused by the input signal provided with a watermark being deteriorated somehow between its generation or output at the output 16 and the detection by detector 100 or the reception at the input 112, such as, for example, by a coarser quantization of the audio values or the like.

Before another embodiment of a scheme of embedding a watermark into an audio signal will be described referring to FIGS. 4 and 5, which, with regard to the scheme described referring to FIGS. 1 to 3, only differs as to the type and manner of the transfer of the audio signal from the time domain to the frequency/modulation frequency domain, exemplary fields of application or ways in which the embedding scheme described before can be used in a useful manner will be described subsequently. The following examples thus exemplarily refer to fields of application in broadcast monitoring and in DRM systems, such as, for example, conventional WM (watermark) systems. The possibilities of application described below, however, do not only apply for the embodiment of FIGS. 4 and 5 to be described below.

On the one hand, the embodiment for embedding a watermark in an audio signal described above may be used to prove authorship of an audio signal. The original audio signal arriving at the input 12 exemplarily is a piece of music. While producing pieces of music, author information in the form of a watermark can be introduced into the audio signal by the embedder 10, the result being an audio signal provided with a watermark at the output 16. Should a third person claim to be the author of the corresponding piece of music or music title, the proof of the actual authorship can be done using the watermark which can be extracted again by means of the detector 100 from the audio signal provided with a watermark and otherwise is inaudible in normal playing.

Another possible usage of the watermark embedding illustrated above is to use watermarks for logging the broadcast program of TV and radio stations. Broadcast programs are often divided into different portions, such as, for example, individual music titles, radio plays, commercials or the like. The author of an audio signal or at least that person allowed to and wanting to make money with a certain music title or a commercial can provide his or her audio signal with a watermark by the embedder 10 and make the audio signal provided with a watermark available to the broadcasting operator. In this manner, music titles or commercials can be provided with a respective unambiguous watermark. For logging the broadcast program, a computer checking the broadcast signal for a watermark and logging watermarks found may exemplarily be used. Using the list of the watermark discovered, a broadcast list for the corresponding broadcasting station may be generated easily, which makes accounting and charging easier.

Another field of application is using watermarks for determining illegal copies. In this manner, using watermarks is particularly worthwhile for distributing music over the Internet. If a customer purchases a music title, an unambiguous customer number is embedded into the data using a watermark while transmitting the music data to the customer. The result is music titles into which the watermark is embedded inaudibly. If at a later point in time a music title is found on the Internet at a site not approved, such as, for example, an exchange site, this piece can be checked for the watermark by means of a decoder according to FIG. 3 and the original customer can be identified using the watermark. The latter usage might also play an important role for current DRM (digital rights management) solutions. The watermark in the audio signals provided with watermarks here may serve as a kind of "second line of defense" which still allows tracking the original customer when the cryptographic protection of an audio signal provided with a watermark has been bypassed.

Further applications for watermarks are, for example, described in the publication Chr. Neubauer, J. Herre, "Advanced Watermarking and its Applications", 109th Audio Engineering Society Convention, Los Angeles, September 2000, Preprint 5176.

Subsequently, an embedder and a watermark decoder will be described referring to an embodiment of an embedding scheme where, compared to the embodiment of FIGS. 1-3, a different transfer of the audio signal from the time domain to the frequency/modulation frequency domain is used. In the subsequent description, elements in the figures being identical or having the same meaning as those of FIGS. 1 and 3 are provided with the same reference numerals as are provided in FIGS. 1 and 3, wherein for a more detailed discussion of the mode of functioning or meaning of these elements reference is additionally made to the description of FIGS. 1-3 to avoid duplication.

Figure 4:
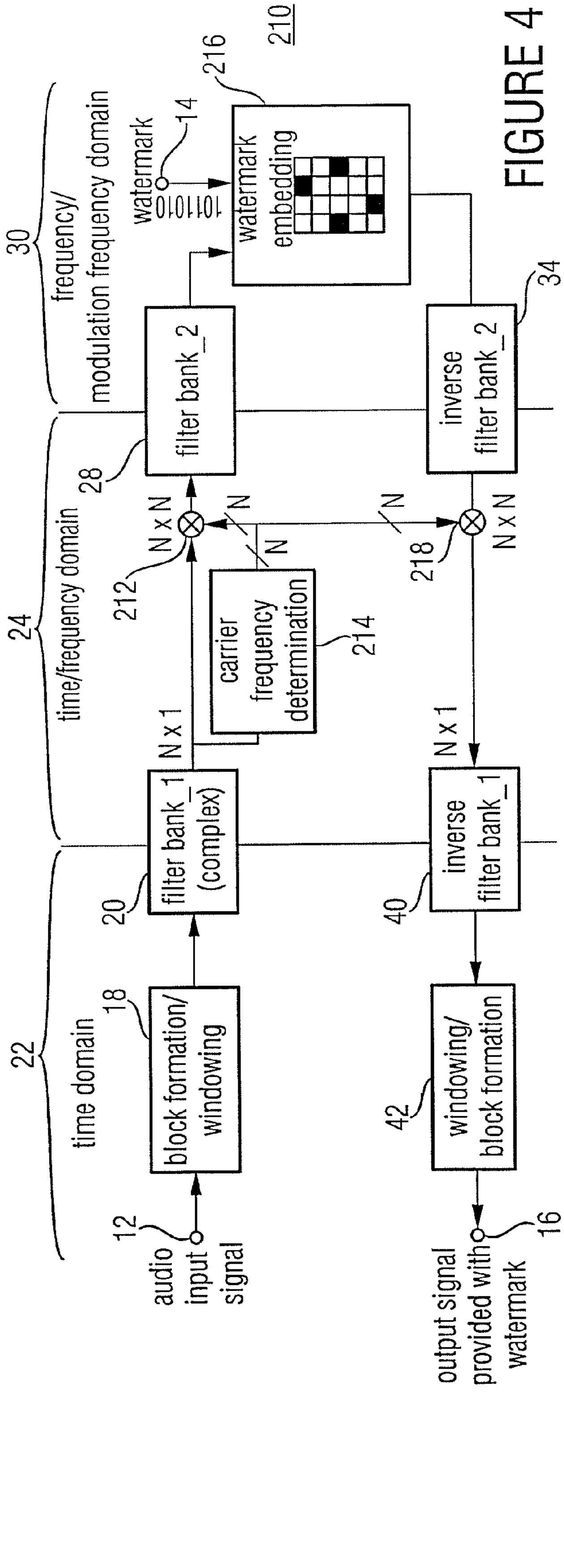
FIG. 4 is a block circuit diagram of a device for embedding a watermark into an audio signal according to another embodiment of the present invention.

The embedder of FIG. 4 which is generally indicated by 210 includes, as does the embedder of FIG. 1, an audio signal input 12, a watermark input 14 and an output 16 for outputting the audio signal provided with a watermark. What follows after the input 12 are windowing means 18 and the first filter bank 20 to transfer the audio signal block by block into blocks 60 of spectral values 62 (FIG. 2), wherein the sequence of blocks of spectral values forming by this at the output of the filter bank 20 represents the time/frequency domain representation 24 of the audio signal. In contrast to the embedder 10 of FIG. 1, however, the complex spectral values 62 are not divided into magnitude and phase, but the complex spectral values are completely processed to transfer the audio signal to the frequency/modulation frequency domain. The sequences 70 of successive spectral values of a subband are thus transferred block by block to a spectral representation considering magnitude and phase. Before, however, each subband spectral value sequence 70 is subjected to demodulation. Each sequence 70, i.e. the sequence of spectral values resulting with successive time blocks by a transfer to the spectral range for a certain subband, is multiplied or mixed by a mixer 212 by the complex conjugate of a modulation carrier component which is determined by carrier frequency determining means 214 from the spectral values and, in particular, the phase portion of these spectral values of the time/frequency domain representation of the audio signal. The means 212 and 214 serve to provide a compensation for the fact that the repeat distance of the time blocks is not necessarily tuned to the period duration of the carrier frequency component of the audio signal, i.e. of that audible frequency which on average represents the carrier frequency of the audio signal. In the case of error tuning, successive time blocks are shifted by a different phase offset to the carrier frequency of the audio signal. This has the consequence that each block 60 of spectral values as is output by the filter bank 20 comprises, depending on the phase offset of the respective time blocks to the carrier frequency in the phase portion, a linear phase increase which can be traced back to the time block-individual phase offset, i.e. the slope and axis portion of which depend on the phase offset. Since the phase offset between successive time blocks will at first always increase, the slope, too, of the phase increase going back to the phase offset for each block 60 of spectral values 62 will increase, too until the phase offset becomes zero again, etc.

The above explanation has only referred to individual blocks 60 of spectral values. However, it becomes obvious from the above explanation that a linear phase increase may also be detected for spectral values resulting with successive time blocks for one and the same subband, i.e. a phase increase along the lines in FIG. 2 in the matrix 68. This phase increase, too, can be traced back to and depends on the phase offset of the successive time blocks. All in all, the spectral values 62 in the matrix 68 experience, due to the time offset of the successive time blocks, a cumulative phase change which shows as a plane in the space spanned by the axes 66 and 64.

The carrier frequency determining means 214 thus fits a plane into the unwrapped phases or phases subjected to phase unwrapping or phase development or phase portion lineup of the spectral values 62 of the matrix 68 by suitable methods, such as, for example, a least error square algorithm, and deduces from it the phase increase going back to the phase offset of the time blocks which occurs in the sequences 70 of spectral values for the individual subbands within the matrix 68. All in all, the result, per subband, is a deduced phase increase corresponding to the modulation carrier component sought. The means 214 passes this on to the mixer 212 in order for the respective sequence 70 of spectral values to be multiplied by the mixer 212 by the complex conjugate thereof, or multiplied by $e^{-j(w*m+\Phi)}$, w representing the certain carrier, m being the index for the spectral values and $\phi$ a phase offset of the certain carrier at the time section of the N time blocks considered. Of course, the carrier frequency determining means 214 may also perform one-dimensional fits of a straight into the phase forms of the individual sequences 70 of spectral values 62 within the matrices 68 to obtain the individual phase increases going back to the phase offset of the time blocks. After the demodulation by the mixer 212, the phase portion of the spectral values of the matrix 68 is thus "leveled out" and only varies on average around the phase zero due to the shape of the audio signal itself.

The mixer 212 passes on the spectral values 62 modified in this way to the filter bank 28 which transfers same matrix by matrix (matrix 68 in FIG. 2) to the frequency/modulation frequency domain. Similarly to the embodiment of FIGS. 1-3, the result is a matrix of modulation values where, however, this time both phase and magnitude of the time/frequency domain representation 24 have been considered. Like in the example of FIG. 1, windowing with 50% overlapping or the like may be provided.

The successive modulation matrices generated in this way are passed on to watermark embedding means 216 which receives the watermark 14 at another input. The watermark embedding means 216 exemplarily operates in a similar manner as does the embedding means 32 of the embedder 10 of FIG. 1. The embedding locations within the frequency/modulation frequency domain representation 30, however, are, if necessary, selected using rules considering other masking effects than is the case in the embedding means 32. The embedding locations should, like in the means 32, be selected such that the modulation values modified there have no audible effect on the audio signal provided with a watermark, as will be output later at the output of the embedder 210.

The altered modulation values or the altered or modified modulation matrices are passed on to the inverse filter bank 34, which is how matrices of modified spectral values form from the modified modulation matrices. With these modified spectral values, the phase correction which has been caused by the demodulation by means of the mixer 212 can still be reversed. This is why the blocks of modified spectral values output by the inverse filter bank 34 per subband are mixed or multiplied by means of a mixer 218 by a demodulation carrier component which is a complex conjugate of that having been used by the mixer 212 for this subband before the transfer to the frequency/modulation frequency domain for demodulation, i.e. by performing a multiplication of these blocks by $e^{j(w*m+\Phi)}$, wherein w in turn indicates the certain carrier for the respective subband, m is the index for the modified spectral values and $\phi$ is a phase offset of the certain carrier at the time section of the N time blocks for the respective subband considered. The respective modulator for the respective subband which refers to the contents of a certain subband block or which has been applied after block division by the modulation 212, 214 is inverted again by this before subsequent block merging.

The spectral values obtained in this way still exist in the form of blocks, namely one block of modified spectral value blocks each per subband, and are, if necessary, subjected to OLA or merging for reversing windowing, such as, for example, in the manner described referring to 34 of FIG. 1. The unwindowed spectral values obtained in this way are then available as streams of modified spectral values per subband and represent the time/frequency domain representation of the audio signal provided with a watermark. What follows after the output of the mixer 218 are the inverse filter bank 40 and the windowing means 42 which perform transfer of the time/frequency domain representation of the audio signal provided with a watermark to the time domain 22, the result being a sequence of audio value representing the audio signal provided with a watermark at the output 16.

An advantage of the procedure according to FIG. 4 compared to the procedure of FIG. 1 is that, due to the fact that phase and magnitude together are used for the transfer to the frequency/modulation frequency domain, no reintroduction of modulation portions is caused when recombining phase and modified magnitude portion.

Figure 5:
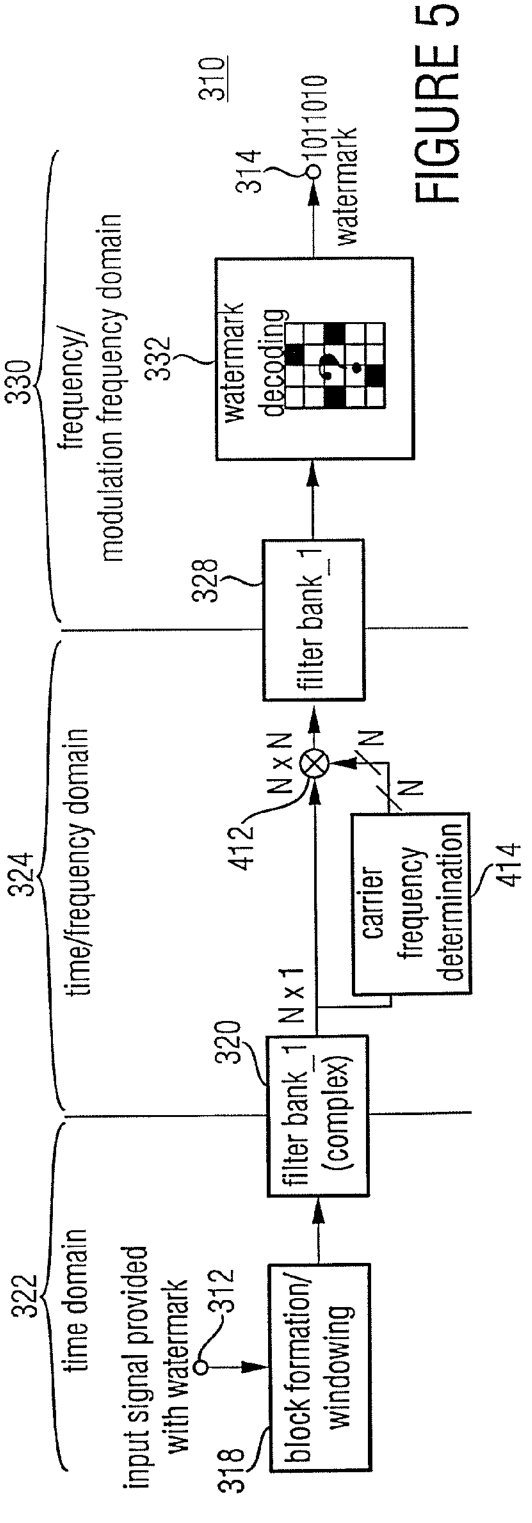
FIG. 5 is a block diagram of a device for extracting a watermark embedded by the device of FIG. 4 from an audio signal provided with a watermark.

A watermark decoder suitable for processing the audio signal provided with a watermark as is output by the embedder 210 to extract the watermark therefrom is shown in FIG. 5. The decoder, which is generally indicated by 310, includes an input 312 for receiving the audio signal provided with a watermark and an output 314 for outputting the extracted watermark. What follows after the input 312 of the decoder 310 are, connected in series and in the order as will be mentioned below, windowing means 318, a filter bank 320, a mixer 412 and a filter bank 328, wherein another input of the mixer 412 is connected to an output of carrier frequency determining means 414 comprising an input connected to the output of the filter bank 320. The components 318, 320, 412, 328 and 414 serve the same purpose and operate in the same manner as do the components 18, 20, 212, 28 and 214 of the embedder 210. In this manner, the input signal provided with a watermark is transferred in the decoder 310 from the time domain 322 via the time frequency domain 324 to the frequency/modulation frequency domain 330, where watermark decoding means 332 receives and processes the frequency/modulation frequency domain representation of the audio signal provided with a watermark to extract the watermark and output same at the input 314 of the decoder 310. As has been mentioned before, the modulation matrices fed to the decoding means 332 in the decoder 310 differ by less than those fed to the decoding means 132 to those fed to the embedding means 216 in the embodiment of FIGS. 1-3 since there is no recombination between the phase portion and the modified magnitude portion in the embedder system of FIG. 4.

The above embodiments have consequently related to a connection of the subject areas "subband modulation spectral analysis" and "digital watermark" not known in the past to form an overall system for introducing watermarks with an embedder system on the one side and a detector system on the other side. The embedder system serves for introducing the watermark. It consists of a subband modulation spectral analysis, an embedder stage performing modification of the signal representation achieved by the analysis, and synthesis of the signal of the modified representation. The detector system in contrast serves for recognizing a watermark present in an audio signal provided with a watermark. It consists of a subband modulation spectral analysis and a detection stage which recognizes and evaluates the watermark using the signal representation obtained by the analysis.

With regard to the selection of those locations in the frequency/modulation frequency domain or those modulation values in the frequency/modulation frequency domain used for embedding the watermark or extracting the watermark, it is to be pointed out that this selection should be made as to psycho-acoustic factors to ensure that the watermark is inaudible when playing the audio signal provided with a watermark. Masking effects in the modulation spectral range might be made use of for a suitable selection. Here, reference is, for example, made to T. Houtgast: "Frequency Selectivity in Amplitude Modulation Detection", J. Acoust. Soc. Am., vol. 85, No. 4, April 1989, which is incorporated herein with regard to selecting inaudibly modifiable modulation values in the frequency/modulation frequency domain.

For a better understanding of the modulation spectral analysis in general, reference is made to the following publications which refer to audio coding using a modulation transform, and wherein the signal is divided into frequency bands by a transform, subsequently a division as to magnitude and phase is performed and then, while the phase is not processed further, the magnitudes of each subband are transformed again in a second transform via a number of transform blocks. The result is a frequency division of the time envelope of the respective subband into "modulation coefficients". These continuative documents include the article M. Vinton and L. Atlas, "A Scalable and Progressive Audio Codec", in Proceedings of the 2001 IEEE ICASSP, May 7-11, 2001, Salt Lake City, US 2002/0176353A1 by Atlas and others having the title "Scalable And Perceptually Ranked Signal Coding and Decoding", the article J. Thompson and L. Atlas, "A Non-uniform Modulation Transform for Audio Coding with Increased Time Resolution", in Proceedings of the 2003 IEEE ICASSP, April 6-10, Hong Kong, 2003, and the article L. Atlas, "Joint Acoustic And Modulation Frequency", Journal on Applied Signal Processing 7 EURASIP, pp. 668-675, 2003.

The above embodiments only represent exemplary ways of being able to provide audio recordings with inaudible additional information robust against manipulation and thus introducing the watermark in the so-called subband modulation spectral range and performing detection in the subband modulation spectral range. However, different variations may be made to these embodiments. The windowing means mentioned above might only serve for block formation, i.e. multiplication or weighting by the window functions might be omitted. In addition, window functions other than the magnitudes of trigonometric functions mentioned before might be used. Also, the 50% block overlapping might be omitted or be performed differently. Correspondingly, the block overlapping on the side of the synthesis might include operations other than a pure addition of matching audio values in successive time blocks. In addition, windowing operations in the second transform stage might also be varied correspondingly.

Additionally, it is pointed out that the audio signal introduction need not necessarily be made from the time domain to the frequency/modulation frequency domain representation and from there be reversed again—after modification—to the time domain representation. Additionally, it would also be possible to modify the two embodiments mentioned before in that the values as are output by the recombining means 38 or the mixer 218 are united to form an audio signal provided with a watermark in a bitstream to be present in a time/frequency domain.

In addition, the demodulation used in the second embodiment might also be designed to be different, such as, for example, by alteration of the phase forms of the spectral value blocks within the matrices 68 by measures other than by pure multiplication by a fixed complex carrier.

With regard to the above embodiments for possible decoders, as have been discussed referring to FIGS. 3 and 5, it is pointed out that, due to the matching of the blocks arranged between the watermark decoding means and the input with the corresponding ones from the pertaining embedder, all variation possibilities having been described with regard to the embedder in relation to these means apply in the same way for the watermark decoders of FIGS. 3 and 5.

It is also to be pointed out that the above embodiments have exclusively related to watermark embedding with regard to audio signal but that the present watermark embedding scheme may also be applied to different information signals, such as, for example, to control signals, measuring signals, video signals or the like, to check same, for example, as to their authenticity. In all these cases, it is possible by the presently suggested scheme to perform embedding of information such that this does not impede the normal usage of the information signal in the form provided with a watermark, such as, for example, analysis of the measurement result or the optical impression of the video or the like, which is why in these cases, too, the additional data to be embedded are referred to as watermark.

In particular, it is pointed out that, depending on the circumstances, the inventive scheme may also be implemented in software. The implementation may be on a digital storage medium, in particular on a disc or a CD having control signals which may be read out electronically which can cooperate with a programmable computer system such that the corresponding method will be executed. Generally, the invention thus also is in a computer program product having a program code stored on a machine-readable carrier for performing the inventive method when the computer program product runs on a computer. Put differently, the invention may thus also be realized as a computer program having a program code for performing the method when the computer program runs on a computer.

While this invention has been described in terms of several preferred embodiments, there are alterations, permutations, and equivalents which fall within the scope of this invention. It should also be noted that there are many alternative ways of implementing the methods and compositions of the present invention. It is therefore intended that the following appended claims be interpreted as including all such alterations, permutations, and equivalents as fall within the true spirit and scope of the present invention.

What is claimed is:

1. A device for introducing a watermark into an information signal, comprising:

a first transferrer for transferring a time representation of the information signal to a time/spectral representation of the information signal, by block-wisely spectrally decomposing the time representation of the information signal;

a second transferrer for transferring the time/spectral representation of the information signal to a spectral/modulation spectral representation of the information signal, by block-wisely spectrally decomposing the time/spectral representation of the information signal;

a modifier for modifying the spectral/modulation spectral representation of the information signal in dependence on the watermark to be introduced to obtain a modified spectral/modulation spectral representation; and a processor for forming an information signal provided with a watermark based on the modified spectral/modulation spectral representation.

2. The device according to claim 1, wherein the first transferrer is configured to decompose the time representation into a plurality of spectral components to obtain a sequence of spectral values per spectral component, and the second transferrer in configured to spectrally decompose, for a predetermined spectral component, the sequence of spectral values block by block to obtain a part of the spectral/modulation spectral representation.

3. The device according to claim 2, wherein the second transferrer is configured to at first multiply the sequence of spectral values block by block by a complex carrier such that a magnitude of a mean slope of a phase form of the sequence of spectral values decreases to obtain demodulated blocks of spectral values, and to then spectrally decompose the demodulated blocks of spectral values block by block to obtain the part of the modified spectral/modulation spectral representation.

4. The device according to claim 3, wherein the second transferrer is configured to, depending on the time/spectral representation of the information signal, vary, block by block, the complex carrier by which the sequence of spectral values is multiplied.

5. The device according to claim 4, wherein the second transferrer is configured to unwrap phases of the spectral values in the sequence of spectral values block by block to obtain a phase form, to determine a mean slope of the phase form and to determine the complex carrier based on the mean slope.

6. The device according to claim 5, wherein the second transferrer is further configured to determine an axis portion of the phase form from the phase form and to determine the complex carrier additionally based on the axis portion.

7. The device according to claim 5, wherein the variator for varying is further formed to determine an axis portion of the phase form from the phase form and to determine the complex carrier additionally based on the axis portion.

8. The device according to claim 3, wherein the processor for forming the information signal provided with a watermark comprises:

a retransferrer for retransferring the information signal from the modified spectral/modulation spectral representation to a modified time/spectral representation to obtain modified demodulated blocks of spectral values for the predetermined spectral component a multiplier for multiplying the modified demodulated blocks of spectral values block by block by a carrier being a complex conjugate to the complex carrier to obtain modified blocks of spectral values; and a uniter for uniting the modified demodulated blocks of spectral values to form a modified sequence of spectral values to obtain a part of a time/spectral representation of the information signal provided with a watermark.

9. The device according to claim 8, wherein the processor for forming further comprises:

a retransferrer for retransferring the information signal provided with a watermark from the time/spectral representation to the time representation.

10. The device according to claim 2, wherein the second transferrer is configured to at first subject the sequence of spectral values to a magnitude calculation to obtain a sequence of magnitudes of spectral values, and to then transform the sequence of magnitudes of spectral values block by block to the modulation spectral representation to obtain the part of the spectral/modulation spectral representation.

11. The device according to claim 10, wherein the processor for forming the information signal provided with a watermark comprises:

a retransferrer for retransferring the information signal from the modified spectral/modulation spectral representation to a modified time/spectral representation to obtain a modified sequence of spectral values for the predetermined spectral component; and a recombiner for recombining the modified sequence of spectral values with phases which are based on phases of the sequence of spectral values to obtain a part of a time/spectral representation of the information signal provided with a watermark.

12. The device according to claim 1, wherein the first transferrer comprises:

a block forming processor for forming a sequence of blocks of information values from the time representation of the information signal; and a first decomposer for spectrally decomposing each of the sequence of blocks of information values to obtain a sequence of spectral value blocks, each spectral value block comprising a spectral value for each of a predetermined plurality of spectral components so that the sequence of spectral value blocks forms a sequence of spectral values per spectral component;

wherein the second transferrer comprises:

a second decomposer for spectrally decomposing a predetermined sequence of the sequences to obtain a block of modulation values, wherein the modifier for modifying is configured to modify the block of modulation values in dependence on the watermark to be introduced to obtain a modified block of modulation values, and the processor for forming is formed to form the information signal provided with a watermark based on the modified block of modulation values.

13. The device according to claim 12, wherein the processor for forming is configured to retransfer the modified block of modulation values from the spectral decomposition to obtain a modified sequence of spectral values, and to retransfer a sequence of modified spectral blocks which is based on the modified sequence of spectral values to obtain a sequence of modified blocks of information values, and to unite the modified blocks of information values to obtain the information signal provided with a watermark.

14. The device according to claim 12, wherein the block forming processor is formed to extract the blocks of information values from the information signal such that the blocks of information values are associated to successive time sections of the information signal overlapping one another by one half, and the processor for forming is formed to, when uniting, overlap the modified time blocks to one another by one half and combine aligned information values of neighboring information blocks.

15. The device according to claim 12, wherein the first decomposer configured such that it provides a sequence of complex spectral values per spectral component when spectrally decomposing, and the second decomposer is configured to only spectrally decompose the magnitudes of the complex spectral values to obtain the block of modulation values.

16. The device according to claim 15, wherein the processor for forming is formed to retransfer the modified block of modulation values from the spectral decomposition to obtain a modified sequence of spectral values, to adjust phases of the sequence of complex spectral values in dependence on the modification by the modifier for modifying to obtain a sequence of adjusted phase values, to recombine the sequence of adjusted phase values with the modified sequence of spectral values to obtain a recombined modified sequence of spectral values, and to retransfer a sequence of modified spectral value blocks which is based on the recombined modified sequence of spectral values to obtain the modified blocks of information values.

17. The device according to claim 12, wherein the first decomposer is configured such that it provides a sequence of complex spectral values per spectral component when spectrally decomposing, and the second decomposer is configured to at first manipulate the sequence of spectral values such that a phase of the spectral values of the at least one sequence of spectral values is increased or decreased by a magnitude continually increasing with the sequence or decreasing to obtain a phase-manipulated sequence of spectral values, and to then spectrally decompose the phase-manipulated sequence of spectral values to obtain the at least one block of modulation values, and the processor for forming is formed to retransfer the modified block of modulation values from the spectral decomposition to obtain a modified sequence of spectral values, to manipulate the modified sequence of spectral values conversely to the second decomposer such that a phase of the spectral values of the at least on sequence of spectral values is increased or decreased by a magnitude continuously increasing with the sequence or decreasing to obtain a manipulated sequence of spectral values, to retransfer a sequence of modified spectral blocks which is based on the modified sequence of spectral values to obtain a sequence of modified blocks of information values, and to unite the modified blocks of information values to obtain the information signal provided with a watermark.

18. The device according to claim 1, wherein the modifier for modifying is adjusted to perform the modification at locations of the spectral/modulation spectral representation varying in time.

19. The device according to claim 1, wherein the modifier for modifying is adjusted to perform modification in dependence on the information signal.

20. The device according to claim 1, wherein the modifier for modifying is adjusted to perform the modification, such that, due to psycho-acoustic masking effects, the modification does not result in an audible alteration of the information signal provided with a watermark.

21. The device according to claim 1, wherein the watermark indicates author information, an identification number characterizing the information signal or a customer number.

22. A device for extracting a watermark from an information signal provided with a watermark, comprising:

a first transferrer for transferring a time representation of the information signal provided with a watermark to a time/spectral representation, by block-wisely spectrally decomposing the time representation of the information signal provided with the watermark;

a second transferrer for transferring the time/spectral representation to a spectral/modulation spectral representation, by block-wisely spectrally decomposing the time/spectral representation of the information signal; and a deriver for deriving the watermark based on the spectral/modulation spectral representation.

23. A computer-readable storage medium having stored thereon a set of instructions to perform the process of introducing a watermark into an information signal, comprising:

transferring a time representation of the information signal to a time/spectral representation of the information signal, by block-wisely spectral decomposing the time representation of the information signal;

transferring the time/spectral representation of the information signal to a spectral/modulation spectral representation of the information signal, by block-wisely spectrally decomposing the time/spectral representation of the information signal;

modifying the spectral/modulation spectral representation in dependence on the watermark to be introduced to obtain a modified spectral/modulation spectral representation;

forming an information signal provided with a watermark based on the modified spectral/modulation spectral representation, and disturbing the information signal provided with the watermark over the internet, broadcasting the information signal provided with the watermark, or generating a sound carrier having the information signal provide with the watermark stored thereon.

24. A computer-readable storage medium having stored thereon a set of instructions to perform the process of extracting a watermark from an information signal provided with a watermark, comprising:

transferring the representation of the information signal provided with a watermark to a time/spectral representation, by block-wisely spectrally decomposing the time representation of the information signal provided with the watermark;

transferring the time/spectral representation to a spectral/modulation spectral representation, by block-wisely spectral decomposing the time/spectral representation of the information signal;

deriving the watermark based on the spectral/modulation spectral representation; and broadcasting the information signal with logging the watermark derived, or intercepting the information signal in the internet or reading the information signal from a sound carrier, to extract the watermark.

25. A device for introducing a watermark into an information signal, comprising:

a transferrer for transferring the information signal from a time representation to a spectral/modulation spectral representation, wherein the transferrer for transferring to the spectral/modulation spectral representation comprises:

a transferrer for transferring the information signal to a time/spectral representation by transforming the information signal block by block; and a transferrer for transferring the information signal from the time/spectral representation to the spectral/modulation spectral representation, wherein the transferrer for transferring the information signal to a time/spectral representation is formed to divide the time/spectral representation to a plurality of spectral components to obtain a sequence of spectral values per spectral components, and the transferrer for transferring the information signal from the time/spectral representation to the spectral/modulation spectral representation comprises a divider for, for a predetermined spectral component, spectral dividing the sequence of spectral values block by block to obtain a part of the spectral/modulation spectral representation, wherein the divider for, for a predetermined spectral component, spectral dividing the sequence of spectral values block by block is formed to at first multiply the sequence of spectral values block by block by a complex carrier such that a magnitude of a mean slope of a phase form of the sequence of spectral values decreases to obtain demodulated blocks of spectral values, and to the spectrally divide the demodulated blocks of spectral values block by block to obtain the part of the modified spectral/modulation spectral representation, wherein the divider for, for a predetermined spectral component, spectrally dividing the sequence of spectral values block by block is formed to at first multiply the sequence of spectral values block by block by a complex carrier such that a magnitude of a mean slope of a phase form of the sequence of spectral values decreases to obtain demodulated blocks of spectral values, and to then spectrally divide the demodulated blocks of spectral values block by block to obtain the part of the modified spectral/modulation spectral representation, wherein the divider for, for a predetermined spectral component, spectrally dividing the sequence of spectral values block by block comprises a variator for, depending on the time/spectral representation of the information signal, varying block by block the complex carrier by which the sequence of spectral values is multiplied, wherein the variator for varying is formed to unwrap phases of the spectral values in the sequence of spectral values block by block for varying the complex carrier block by block to obtain a phase form, to determine a mean slope of the phase form and to determine the complex carrier based on the mean slope;

a modifier for modifying the information signal in the spectral/modulation spectral representation in dependence on the watermark to be introduced to obtain a modified spectral/modulation spectral representation; and a processor for forming an information signal provided with a watermark based on the modified spectral/modulation spectral representation.

* * * * *

UNITED STATES PATENT AND TRADEMARK OFFICE
CERTIFICATE OF CORRECTION

PATENT NO. : 7,676,336 B2
APPLICATION NO. : 11/554492
DATED : March 9, 2010
INVENTOR(S) : Juergen Herre et al.

It is certified that error appears in the above-identified patent and that said Letters Patent is hereby corrected as shown below:

Claim 2, Column 17, Line 36, replace the word “in” with --is--. This line should appear as follows:

ferrer is configured to spectrally decompose, for a predeter-

Claim 17, Column 19, Line 52, replace the word “on” with --one--. This line should appear as follows:

phase of the spectral values of the at least one sequence of

Claim 23, Column 20, Line 28, replace the word “spectral” with --spectrally--. This line should appear as follows:

nal, by block-wisely spectrally decomposing the time rep-

Claim 23, Column 20, Line 40, replace the word “a” with --the--. This line should read as follows:

forming an information signal provided with the watermark

Claim 23, Column 20, Line 46, replace the word “provide” with --provided--. This line should read as follows:

sound carrier having the information signal provided with

Claim 24, Column 20, Line 59, replace the first word “spectral” with --spectrally--. This line should read as follows:

spectrally decomposing the time/spectral representation

Claim 25, Column 21, Line 19, replace the word “components” with --component--. This line should appear as follows:

values per spectral component, and the transferrer for

Signed and Sealed this

Twenty-third Day of November, 2010

David J. Kappos
*Director of the United States Patent and Trademark Office*

Claim 25, Column 21, Line 23, replace the second word "spectral" with --spectrally--. This line should appear as follows:

mined spectral component, spectrally dividing the

Claim 25, Column 21, Line 27, replace the first word "spectral" with --spectrally--. This line should appear as follows:

ponent, spectrally dividing the sequence of spectral values

Claim 25, Column 21, Line 32, replace the word "the" with --then--. This line should appear as follows:

demodulated blocks of spectral values, and to then spec-